Aug. 8, 1950

H. C. A. VAN DUUREN

SIGNAL STORING AND CODE CONVERTING RADIO TELEGRAPH SYSTEM 2,518,405

Filed Jan. 15, 1948

2 Sheets-Sheet 1

INVENTOR.
Hendrik C. A. van Duuren
BY Brown Jackson, Boettcher & Dienner
Attorneys Aug. 8, 1950 H. C. A. VAN DUUREN 2,518,405

SIGNAL STORING AND CODE CONVERTING RADIO TELEGRAPH SYSTEM

Filed Jan. 15, 1948 2 Sheets-Sheet 2

INVENTOR.
Hendrik C. A. van Duuren
BY Brown, Jackson, Boettcher & Dienner
Attorneys Patented Aug. 8, 1950

2,518,405

UNITED STATES PATENT OFFICE 2,518,405

SIGNAL STORING AND CODE CONVERTING RADIO TELEGRAPH SYSTEM

Hendrik C. A. van Duuren, Wassenaar, Netherlands

Application January 15, 1948, Serial No. 2,435
In the Netherlands November 18, 1946

Section 1, Public Law 690, August 8, 1946
Patent expires November 18, 1966

9 Claims. (Cl. 178—2)

The present invention relates to a signal storing and code converting radio telegraph system. The apparatus of my improved system provides for the periodical collection or storing of the elements of signals in an automatic radio telegraph system, such collection or storing of the signal elements occurring concurrently with, or in predetermined time relation to the passing on of these signal elements in the signal transmitting cycle. By virtue of this collection or storing of signals, my improved system affords very effective protection against faulty reception of signals because the disturbed signal is capable of effecting a retransmission from these stored signals until the faulty signal is correctly received.

Heretofore, systems of this nature have been operated with a 7 element code on the radio path and with a strip perforated in a 5 element code in an automatic transmitter, such transmitter being followed by a converter which converts from the 5 element code to the 7 element code. Each 7 element signal is protected as a whole. In these prior systems, the perforated strip is reactuated if a signal has been received faultily, pursuant to the receiving station giving notice of such faulty reception by transmitting a warning signal on the return path. After the automatic transmitter has been stepped back over a number of signals, which number is predetermined in relation to propagation time, the perforated strip once more starts forwardly, commencing with the signal to be repeated. In these prior systems the signals lying between the sending of the signal and the repetition thereof are uselessly registered by the sender.

One of the principal objects of the present invention is to provide an improved system in which this backward movement is not necessary, but the tape is merely stopped when a request for repetition is received. Between the tape transmitter and the code converter of my improved system there is disposed a five-fold group of auxiliary relays, as well as a signal storing or collecting arrangement with five groups of *m* condensers which store *m* signals sequentially. During normal transmission, the windings of these auxiliary relays are connected to the contact tongues of the tape transmitter. The armatures of these auxiliary relays close circuits for the controlling relays of the code converter. The groups of collecting condensers are in parallel relation thereto for storing the signals. If a signal which has been collected in a set or bank of five condensers for *m* steps, and which has also been transmitted, should be received faultily, the adjustment of the auxiliary relays occurs, not through the contacts of the tape transmitter, which is then stopped, but through the corresponding set of condensers, which are then, after the adjustment has been made, again charged through the switched contacts of the auxiliary relays.

Another object of the invention is to provide such a system including a code converter which is sufficiently rapid to be able to cooperate with the new signal repeating arrangement described above. This latter object or feature has been realized by effecting the code conversion through the contacts of relays which are all positioned simultaneously by a 5 unit signal arriving at the converter. The delays that arise in consequence of the consecutive operation of converter relays, owing to the fact that some of them are controlled over the contacts of other relays, have thus been avoided.

The invention will be more clearly understood by reference to the accompanying drawings, in which.

Figure 1:
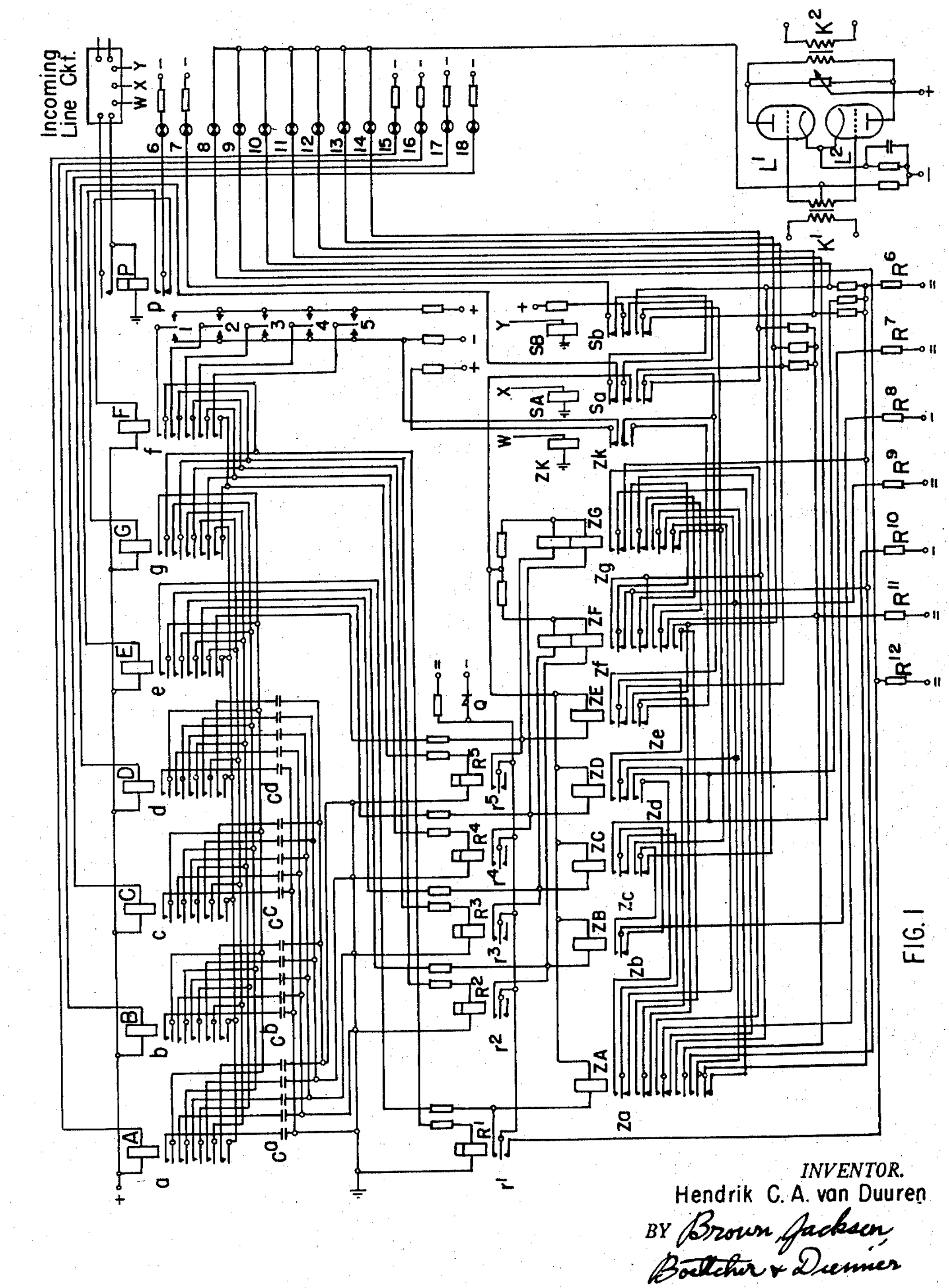
Figure 1 is a circuit diagram of one embodiment of the invention.

The vertical bank of five movable contacts, designated 1 to 5, inclusive, at the right hand side of Figure 1 represent the contact tongues or fingers of a tape transmitter, wherein the five movable contact elements respond to the 5 unit signals punched in the tape. This Baudot 5 unit code is well known in the field of automatic telegraphy. When the tongue contacts are engaging with the marking perforations punched in the tape they are resting against contacts which apply negative current thereto, whereas when they are in their other position corresponding to spacing elements they have positive current applied thereto.

These tongue contacts 1 to 5, inclusive, have connection respectively with a bank of relay contacts *f* which respond to relay F. This latter relay F is energized periodically, i. e. once for each letter signal or other signal of the 5 element code shown in the left hand column of Figure 2. Such periodical or timed energization of relay F occurs through rotating contact 6, which constitutes one of a bank or group of rotating contacts effecting circuit closures once for each signal.

The five relay contacts *f* are electrically connected with a companion series of five relay contacts *g* which normally stand in open position and are only moved to closed position when a signal repeating operation is to occur. The bank of relay contacts *g* respond to relay G, which is adapted to be energized alternatively with relay F through relay contact *p* of signal repeating relay P. Under normal signalling conditions the signal repeating relay P is non-operative, at which time its contact *p* occupies the position illustrated for directing operating pulses from rotating contact 6 to relay F. When faulty signal reception calls for a repetition of signals, the energization of signal repeating relay P by conventional type incoming line equipment; such as, for example, that disclosed in van Duuren Patent 2,279,353 granted April 14, 1942 which is illustrated in block form in Figure 1, shifts relay contact *p* to direct the next relay energizing pulse from rotary contact 6 to relay G.

The marking and spacing elements transmitted from the transmitter tongue contacts 1 to 5, inclusive, through relay contacts *f* are conveyed to a series of five polarized relays $R^1$ to $R^5$, inclusive. The relay contacts *g* of signal repeating relay G are also connected so as to be operative to transmit marking and spacing elements to the polarized relays $R^1$—$R^5$, as will be later described. These polarized relays $R^1$—$R^5$ have their armature contacts $r^1$ to $r^5$ electrically connected with the windings of code-converting relays ZA, ZB, ZC, ZD, ZF and ZG. When the polarized relays $R^1$—$R^5$ are energized by negative marking current, these relays so actuate their armature contacts that the code converter relays ZA, ZB, ZC, ZD, ZE, ZF or ZG also receive negative current by way of the rectifying unit Q.

The other terminal of each relay winding $R^1$—$R^5$ is connected to ground, and is also connected to a group of four condensers $C^a$, $C^b$, $C^c$ and $C^d$ associated with each polarized relay. The other terminals of these signal storing condensers are connected with relay armatures *a, b, c* and *d* which have multiple connection with repeating relay contacts *g*, and also with a bank of relay contacts *e*. The five series of relay contacts *a*—*a*, etc., *b*—*b*, etc., *c*—*c*, etc. and *d*—*d*, etc. respond respectively to the sequence relays A, B, C and D. These latter sequence relays are controlled sequentially through the rotating shaft contacts 15, 16, 17 and 18, respectively, in such a way that for four consecutive signals successive series or columns of contacts *a, b, c* or *d* are closed at each signal. The rotating contacts 15, 16, 17 and 18 are mounted on a timing shaft which rotates at a speed one-fourth that of the shaft which drives the rotating contacts 6, 7, 8, 9, 10, 11, 12, 13 and 14. It will thus be seen that in a train of signals, the last four signals that are transmitted consecutively are stored in the form of combinations of positive and negative charges on the groups of condensers $C^a$, $C^b$, $C^c$ and $C^d$, because relay winding E that actuates relay contacts *e* is also energized shortly after a signal has been impressed upon polarized relays $R^1$—$R^5$.

Referring now to the operations that occur when a signal is disturbed or mutilated on the outgoing radio path, the receiving station responds to this mutilated signal by transmitting a warning or corrective signal back over the return radio path to the transmitting station, as a result of which the signal repeating relay P is operated. Such operation of relay P causes its contact *p* to be shifted over to its other position for interrupting the energizing circuit to relay F and completing the energizing circuit for relay G. Concurrently therewith, the perforated tape is stopped so that no further tape feeds through the tape transmitter until the signal repeating function has been performed. As a result of the switching function performed by relay contact *p*, relay G is operated by the closing of contact 6 rather than relay F. The closing of the bank of relay contacts *g* upon the energization of relay G places the polarized relays $R^1$—$R^5$ in circuit to receive stored signal charges from the groups of condensers $C^a$—$C^d$ through relay contacts *a, b, c* or *d*. The energization combination of positive and negative charges transmitted to the polarized relays $R^1$—$R^5$ in the initial signal repeating operation is dependent upon which of the series of contacts *a, b, c,* or *d* is operated first. Assuming, for example, that the group of relay contacts *b* have been the last previously closed group of contacts at the time of signal mutilation, then it follows that the relay contacts of group *c* are the next to be closed, such contacts being closed by the energization of relay C through rotating contact 17. Upon the closing of the group of contacts *c* the five condensers $C^c$, $C^c$, etc. are then discharged by way of relay contacts *g* to the five polarized relays $R^1$—$R^5$. However, the condensers again receive their respective positive or negative charges of the same signal, such being brought about by the operation of the polarized relays $R^1$—$R^5$. As previously pointed out, each condenser in a series of condensers is individual to an associated one of the relays $R^1$—$R^5$ inclusive. Thus, if the fourth element of a signal is a space element, positive potential is applied over tongue contacts 4, contacts *f* and the winding of relay $R^4$ to ground, whereby its armature $r^4$ is moved to its lower position. As relay E operates a short interval thereafter, the fourth condenser of the series associated with the operated one of the sequence relays A to D inclusive will receive a positive charge over a circuit which extends by way of positive potential, contacts S*b*, S*a*, the winding of relays ZD and ZG, contacts *e*, contacts of the operated one of the sequence relays A, B, C, or D, the fourth condenser of the series and ground. On the other hand, if the fourth element is a marking element negative battery is applied by tongue contact 4 over contacts *f* to the winding of relay $R^4$ and ground, whereby the armature therefor is moved to its upper position, and negative battery is connected to the condenser over a circuit extending from negative battery over rectifier Q, contacts $r^4$, contacts *e*, the contacts of the operated sequence relay A, B, C, or D, the fourth condenser of the series and ground. Thus, if the relay $R^4$ is operated by a negative current responsive to receipt of a marking element, the fourth condenser of the assigned series assumes a negative charge.

Upon operation of relay G and the four sequence relays A, B, C, and D, responsive to faulty signal transmission and the consequent receipt of a warning signal, the fourth condenser is in its turn connected to relay $R^4$ by its associated sequence relay and the relay $R^4$ is re-operated to its upper position to effect retransmission of the same signal which was previously transmitted. If relay $R^4$ was initially operated by a positive charge, the condenser will have initially assumed a positive charge, and on reconnection to relay $R^4$ effects re-operation of the armature $r^4$ to its downward position. On the other hand, if relay $R^4$ was initially operated by a negative charge, the condenser will have initially assumed a negative charge in the manner described and on reconnection to relay $R^4$ will effect re-operation of the armature $r^4$ to its upper position.

It is obvious that as the relay $R^4$ is re-operated to its initial position by the condenser to retransmit the signal, and as relay E is subsequently cyclically operated as heretofore described, the same charging circuit is recompleted for the fourth condenser of the effective series. Assuming, for example, that polarized relay $R^4$ receives a specific negative current or charge from its associated condenser $C^c$, then the armature contact $r^4$ of this relay lies resting in its upper marking position, and with subsequent operation of relay E; there flows a negative current over rectifier Q, contacts $r^4$ the associated relay contact $e$ to this condenser $C^c$ associated with polarized relay $R^4$, so that this condenser is charged again. Assuming, on the contrary, that polarized relay $R^4$ is energized by a positive current, then the associated armature contact $r^4$ is resting in its lower spacing position and there flows a positive current over the normal contacts $Sb$ and $Sa$, thence through relay winding ZG, contacts $R^4$, and relay contact $e$ to the condenser $C^c$ (associated with polarized relay $R^4$ and ground), thereby charging this condenser again. The manner in which this condenser discharging and recharging cycle occurs at each of the other polarized relays $R^1$, $R^2$, $R^3$, and $R^5$ will be apparent from Figure 1. As a succeeding series of four signals is stored on the condenser sets, it will be apparent that the connection of a potential source to those condensers which are connected thereto on the previous series of signals will cause no disturbance of the condenser charge. However, those condensers which were charged to one polarity and are now connected to a potential source of a different polarity will discharge over the connecting circuit and recharge in the reverse direction to the potential and polarity of the connected source.

It will be evident that the signal which has been recorded or established in this case on the five condensers $C^c$ is the last signal but three (fourth-last) which had been transmitted before the operation of relay P. Now this signal is transmitted again; and thereafter, through the successive closing of the groups of contacts $d$, $a$ and $b$, respectively, the last but two (third-last), the last but one (second-last) and the last signal which had been transmitted before the operation of relay P are transmitted again in the signal repeating cycle.

The signal repeating relay P is held energized by a self-holding circuit which extends over a rotary contact (not shown) such as contacts 6–18, so as to be maintained operated during a complete revolution of the shaft on which the contacts 15, 16, 17 and 18 are mounted, or, otherwise stated, relay P is only released by said rotary contact after the four signals immediately preceding the time at which the disturbance occurred, have been retransmitted. Should the retransmission of these four signals again be disturbed, then the transmitter again retransmits the last four signals, etc. This is made possible because, as described above, each signal is regularly recorded or established on the condensers, even if it was transmitted for the 2nd time or the $m$th time.

Referring to the tongue contacts 1–5 of the tape transmitter, it will be seen that the conductor which normally supplies negative potential to the lower contacting elements of these tongue contacts is adapted to have positive potential applied thereto through relay contacts $zk$, appropriate resistors being interposed between the battery sources and such conductor and relay contacts. The relay contact $zk$ is actuated by relay ZK which is arranged to be released when the perforated tape is stopped by the conventional apparatus in the incoming line equipment, which is shown in block in Figure 1, or when no perforated tape is present. Thus, in each of these instances the tongue contacts 1 to 5, inclusive, all receive positive potential irrespective of the positions that they occupy, and hence a 5 unit signal consisting exclusively of spacing elements is transmitted to the code converter, with the resulting transmission of the corresponding 7 unit signal (see Figure 2).

Referring to the lower part of Figure 1 showing the code converter, the middle part of the battery is, for example, connected to ground; the symbol — battery is marking voltage; and the symbol = is an even more negative voltage corresponding to spacing voltage. The function of the rectifying unit is to prevent current from flowing from — to =. The function and operation of the code converter will be described in the transmission of an illustrative signal such as the letter "$f$" which has the following grouping of marking and spacing elements: XOXXO. Irrespective of whether the signal has had its marking and spacing elements established upon the tape transmitter tongues 1 to 5, inclusive, or upon one of the groups of condensers $C^a$, $C^b$, $C^c$ or $C^d$, the polarized relays $R^1$—$R^5$ are now energized as follows: $R^1$ marking, $R^2$ spacing, $R^3$ marking, $R^4$ marking and $R^5$ spacing. Certain of the code converting relays ZA—ZG are now adapted to be energized by parallel circuits extending from positive battery over contacts $Sa$ and $Sb$, the windings of relays ZA to ZG, the closed ones of the contacts $r^1$ to $r^5$ and rectifier Q to negative battery. Specifically contact $r^1$ is now in its raised marking position, whereby an energizing circuit for relay ZA is completed from positive battery over contacts $Sb$, $Sa$, the winding of relay ZA, contacts $r^1$, rectifier Q and negative battery and relay ZA is operated; relay contact $r^2$ is now in its lower spacing position; relay contact $r^3$ is in its upper marking position and relay ZB is accordingly inoperative at this time, so that converter relay ZC, as well as the lower winding of relay ZF, are energized from positive battery over contacts $Sb$ and $Sa$, windings of relays ZF and ZC, closed contacts $r^3$ and rectifier Q to negative battery; relay contact $r^4$ is now in its upper marking position, so that converter relay ZD, as well as one winding of relay ZG, is energized over positive battery, contacts $Sb$ and $Sa$, the winding of relay ZD and the lower winding of relay ZG, closed contacts $r^4$, and rectifier Q to negative battery; and relay contact $r^5$ is now in its lower spacing position whereby relay ZE is not energized at the present time. All of the relay contacts $Za$, $Zc$, $Zd$, $Zf$, $Zg$ and also $Zk$ have now been switched over.

Referring now to the marking and spacing voltages which are impressed upon the rotating shaft contacts 8 to 14, inclusive, during this transmission of the signal "f" (XOXXO in the 5-unit code and OOXOOXX in the 7-unit code): Shaft contact 8 receives spacing voltage over resistance $R^{12}$. Shaft contact 9 receives spacing voltage over resistance $R^6$. Shaft contact 10 receives marking voltage over marking contact Zc, spacing contact Zb, marking contact Zf, marking contact Zg, marking contact Za through resistance $R^8$. Resistance $R^8$ is substantially smaller than resistances $R^7$, $R^9$ or $R^{11}$. Shaft contact 11 receives spacing voltage over marking contact Za through resistance $R^9$. Resistance $R^6$ is substantially smaller than resistance $R^9$. Shaft contact 12 receives spacing voltage over spacing contact $Z^e$, marking contact Zd through resistance $R^6$. Shaft contacts 13 and 14 receive marking voltage over marking contacts Za, Zg, Zf and Za through resistance $R^8$. Resistance $R^8$ is substantially smaller than resistances $R^{11}$ or $R^7$.

Figure 2:
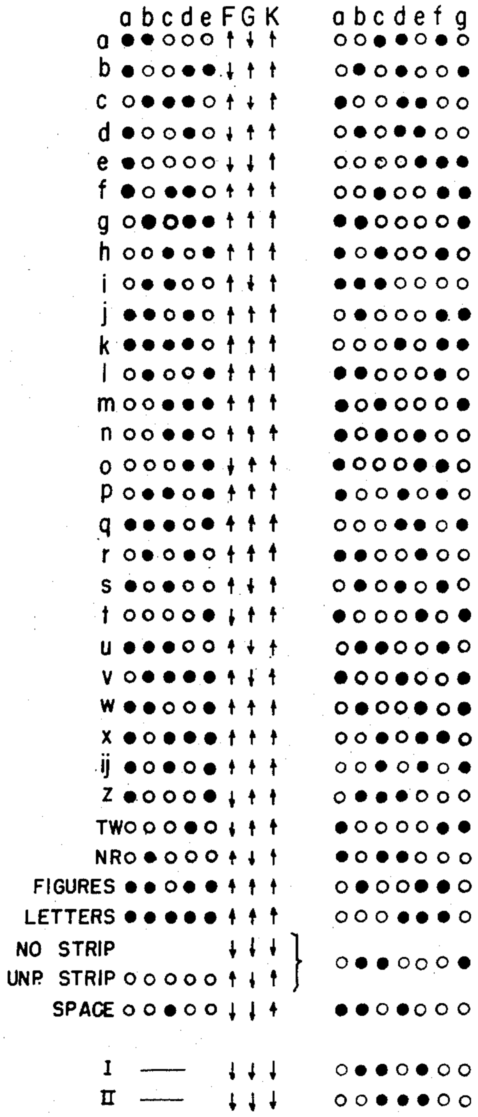
Figure 2 is a parallel column illustration of the conventional signals of a 5 unit code, and the corresponding signals when converted into a 7 unit code.

The marking and spacing voltages thus established on the shaft contacts 8 to 14, inclusive, (corresponding to the marking and spacing voltages in the 7-unit code of the letter "f" of Figure 2) are transmitted successively by the successive operation of the shaft contacts 8 to 14, inclusive, to the grids of two triode tubes $L^1$ and $L^2$. These two triode tubes $L^1$ and $L^2$ are connected in balance, with negative voltage on the cathodes, so that when a marking element of a signal is transmitted from rotary contacts 8 to 14, inclusive, the grids and cathods of these two tubes have the same potential and conduct current through the tubes. Assuming that the input terminals $k^1$ receive a tone, originating, for example, from an oscillator, then this tone is amplified through the tubes and conducted to the output terminal $k^2$ for conduction to the transmitter. When a spacing signal element is transmitted from the rotary contacts 8–14, inclusive, the voltage at the grids of the tubes $L^1$ and $L^2$ is rendered more negative than the voltage at the cathodes, so that the tubes are brought to cut-off, and no tone is then transmitted.

The two repeat request warning signals I and II for indicating signal mutilation and the idle time signal are shown in the 7-unit code at the bottom of the right hand code column in Figure 2. As there illustrated, the idle time signal which is effected with restoration of relays ZA to ZG inclusive, as well as relays SA and SB, comprises the combination of elements consisting of OXXOOOX. For the transmission of these warning signals I and II, the contact Sa, or the contacts Sa and Sb together, are actuated. For example, the operation of relay SA with relays ZA to ZG and SB restored effects, at its contacts, the removal of marking voltage from rotary contact 14 and the application of that marking voltage to contact 12, and the idle time signal becomes signal I which comprises the elements OXXOXOO. The circuit for effecting this change from an idle time signal to warning signal I extends from the source of space potential over resistance $R^{10}$, contacts Za, Zg, Zd, Za, Ze, Zk and Sa to rotary contact 12.

In effecting the transmission of the warning signal II, both relays SB and SA are placed in the operated condition. It will be seen therefrom that the only difference between the warning signal I and warning signal II comprises a transfer operation at the contacts of relay SB, whereby space voltage is removed from rotary contact 11 and applied to rotary contact 9 to thereby effect the signal OOXXXOO. The new energizing circuit extends over resistance $R^7$, contacts Zb, Zc, Za, Zg and Sb to contact 9. As will be seen from Figure 1, in either case contacts Sa operate and relay E cannot be energized, and the perforated tape, as well as the groups of condensers $C^a$, $C^b$, etc. are cut out. Thus, all of the relays are rendered non-operative, from which it will be seen how the warning signals I and II are transmitted.

While I have illustrated and described what I regard to be the preferred embodiment of my invention, nevertheless it will be understood that such is merely exemplary and that numerous modifications and rearrangements may be made therein without departing from the essence of the invention.

I claim:

1. In a telegraph system of the class described, the combination of five sets of transmitter contacts and associated conductors establishing five transmitting channels over which the marking and spacing elements of a 5-unit code are transmitted from a perforated tape, polarized relays for each of said channels responsive to the marking and spacing potentials transmitted therein, code converting relays responsive to the contacts of said polarized relays for converting the 5-unit code into a different code having a larger number of elements, signal storing condensers for each of said transmitting channels, and means responsive to signal mutilation for causing said condensers to energize said polarized relays for repeating the mutilated signal.

2. In a telegraph system of the class described, the combination of five sets of transmitter contacts and associated conductors establishing five transmitting channels over which the marking and spacing elements of a 5-unit code are transmitted from a perforated tape, separate polarized relays responsive to the marking and spacing potentials transmitted over said channels, code converting relays responsive to the contacts of said polarized relays for converting the 5-unit code into a different code having a larger number of units, separate groups of signal storing condensers for each of said five transmitting channels adapted to store the marking and spacing potentials of a sequence of signals, sequence switches for connecting said condensers sequentially in circuit in said transmitting channels for storing the marking and spacing elements of successive signals, and means responsive to signal mutilation for causing said condensers to energize said polarized relays for repeating the mutilated signal.

3. In a telegraph system of the class described, the combination of five sets of transmitter contacts and associated conductors establishing five transmitting channels over which the marking and spacing elements of a 5-unit code are transmitted from a perforated tape, separate polarized relays responsive to the marking and spacing potentials transmitted over said channels, code converting relays responsive to the contacts of said polarized relays for converting the 5-unit code into a different code having a larger number of units, separate groups of signal storing condensers for each of said five transmitting channels adapted to store the marking and spacing potentials of a sequence of signals, sequence switches for connecting said condensers sequentially in circuit in said transmitting channels for storing the marking and spacing elements of successive signals, and means responsive to signal mutilation for causing said condensers to energize said polarized relays for repeating the mutilated signal, said latter means comprising disconnect relay means for disconnecting said polarized relays from said transmitter contacts, and signal repeating relay means for connecting said condensers to energize said polarized relays to effect signal repeating operations.

4. In a radio telegraph system, the combination of five sets of transmitter contacts and associated conductors establishing five transmitting channels over which the marking and spacing elements of a 5-unit code are transmitted from a perforated tape, a polarized relay individual to each of said channels responsive to the marking and spacing potentials transmitted over said channel, code converting relays responsive to the contacts of said polarized relays for converting the 5-unit code into a 7-unit code, a separate group of signal storing condensers individual to each of said transmitting channels for storing the marking or spacing potentials transmitted over each channel in the transmission of a plurality of successive signals, sequence switches for connecting said condensers sequentially in circuit for storing the marking or spacing elements of the signals, successively energized relay means for actuating said sequence switches, disconnect relay means responsive to signal mutilation for disconnecting said polarized relays from said transmitter contacts, and signal repeating relay means responsive to signal mutilation for connecting said condensers to energize said polarized relays to effect signal repeating operations.

5. In apparatus of the class described, the combination of five transmitting channels including transmitter contacts responsive to a perforated tape for transmitting 5-unit code signals made up of marking elements and spacing elements, signal storing condensers associated with said five transmitting channels for the indiscriminate storing of either marking elements or spacing elements of successive signals, relays adapted to respond to the marking elements and spacing elements transmitted over said five channels from said transmitter contacts or from said signal storing condensers, means for causing said relays to respond to the marking elements and spacing elements transmitted from said transmitter contacts during normal signalling, and means for causing said relays to respond to the marking elements and spacing elements transmitted from said signal storing condensers upon signal mutilation.

6. In apparatus of the class described, the combination of transmitting means for transmitting code signals made up of marking elements and spacing elements, signal storing condensers adapted to store said marking elements and spacing elements concurrently with the transmission thereof, relays adapted to respond to the marking elements and spacing elements transmitted from said transmitter contacts or from said signal storing condensers, and means responsive to mutilation of the signal output from said relays for causing said relays to respond to marking elements and spacing elements from said signal storing condensers.

7. In apparatus of the class described, the combination of five transmitting channels including transmitter contacts responsive to a 5-unit code tape for transmitting 5-unit code signals made up of marking elements and spacing elements, signal storing condensers associated with said five transmitting channels adapted for the indiscriminate storing of either the marking elements or the spacing elements of successive signals, polarized relays associated with said five transmitting channels, means for causing said polarized relays to respond to the marking elements and spacing elements of said 5-unit code signals transmitted from said transmitter contacts during normal signalling operations, and for causing said signal storing condensers to store charges therein corresponding to said marking elements and spacing elements concurrently with the operation of said polarized relays, code converting relays controlled by said polarized relays for converting said 5-unit code signals into 7-unit code signals, and means responsive to mutilation of the output signals from said code converting relays for causing said signal storing condensers to discharge to said polarized relays for repeating the mutilated signal.

8. In apparatus of the class described, the combination of five transmitting channels including transmitter contacts responsive to a 5-unit code tape for transmitting 5-unit code signals made up of marking elements and spacing elements, signal storing condensers associated with said five transmitting channels adapted for the indiscriminate storing of either the marking elements or the spacing elements of successive signals, polarized relays associated with said five transmitting channels, means for causing said polarized relays to respond to the marking elements and spacing elements of said 5-unit code signals transmitted from said transmitter contacts during normal signalling operations, and for causing said signal storing condensers to store charges therein corresponding to said marking elements and spacing elements concurrently with the operation of said polarized relays, code converting relays controlled by said polarized relays for converting said 5-unit code signals into 7-unit code signals, and means responsive to mutilation of the output signals from said converter relays for causing said condensers to discharge to said polarized relays, and also causing said condensers to be recharged with corresponding charges.

9. In apparatus of the class described, the combination of five transmitting channels including transmitter contacts responsive to a 5-unit code tape for transmitting 5-unit code signals made up of marking elements and spacing elements, signal storing condensers associated with said five transmitting channels adapted for the indiscriminate storing of either the marking elements or the spacing elements of successive signals, polarized relays associated with said five transmitting channels, means for causing said polarized relays to respond to the marking elements and spacing elements of said 5-unit code signals transmitted from said transmitter contacts during normal signalling operations, and for causing said signal storing condensers to store charges therein corresponding to said marking elements and spacing elements concurrently with the operation of said polarized relays, code converting relays controlled by said polarized relays for converting said 5-unit code signals into 7-unit code signals, and means responsive to mutilation of the 7-unit code signals outgoing from said converter relays for performing the three-fold function of stopping the perforated tape, causing the condensers to discharge their charges to said polarized relays for repeating the mutilated signal, and recharging said condensers with their previously existing charges.

HENDRIK C. A. VAN DUUREN.

REFERENCES CITED

The following references are of record in the file of this patent:

UNITED STATES PATENTS

| Number | Name | Date |
|---|---|---|
| 2,095,144 | Masson | Oct. 5, 1937 |
| 2,279,353 | Van Duuren | Apr. 14, 1942 |
| 2,298,939 | Griffiths et al. | Oct. 13, 1942 |